(12) United States Patent
Wu et al.

(10) Patent No.: US 12,354,843 B2
(45) Date of Patent: Jul. 8, 2025

(54) PROCESS CHAMBER PROCESS KIT WITH PROTECTIVE COATING

(71) Applicant: Applied Materials, Inc., Santa Clara, CA (US)

(72) Inventors: Jian Wu, San Jose, CA (US); Wei Liu, San Jose, CA (US); Theresa Kramer Guarini, San Jose, CA (US); Linlin Wang, Fremont, CA (US); Malcolm Bevan, Santa Clara, CA (US); Lara Hawrylchak, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 699 days.

(21) Appl. No.: 16/418,274

(22) Filed: May 21, 2019

(65) Prior Publication Data

US 2019/0385825 A1 Dec. 19, 2019

Related U.S. Application Data

(60) Provisional application No. 62/685,098, filed on Jun. 14, 2018.

(51) Int. Cl.
*H01J 37/32* (2006.01)

(52) U.S. Cl.
CPC .. *H01J 37/32495* (2013.01); *H01J 37/32477* (2013.01)

(58) Field of Classification Search
CPC . C23C 16/4404; C23C 24/082; C23C 24/085; C23C 26/00; H01J 37/32477; H01J 37/32495; H01J 2237/0268; H01J 2237/16

See application file for complete search history.

(56) References Cited

U.S. PATENT DOCUMENTS 5,972,114 A * 10/1999 Yonenaga ......... C23C 16/45565
118/715
6,251,216 B1 * 6/2001 Okamura .......... H01J 37/32559
438/723

(Continued)

FOREIGN PATENT DOCUMENTS

CN 101589455 A 11/2009
EP 3165629 A1 5/2017

(Continued)

OTHER PUBLICATIONS

International Search Report and Written Opinion for Application No. PCT/US2019/033259 dated Sep. 17, 2019.

(Continued)

*Primary Examiner* — Benjamin Kendall
(74) *Attorney, Agent, or Firm* — Patterson + Sheridan, LLP

(57) ABSTRACT

Embodiments described herein generally relate to a method and apparatus for fabricating a chamber component for a plasma process chamber. In one embodiment a chamber component used within a plasma processing chamber is provided that includes a metallic base material comprising a roughened non-planar first surface, wherein the roughened non-planar surface has an Ra surface roughness of between 4 micro-inches and 80 micro-inches, a planar silica coating formed over the roughened non-planar surface, wherein the planar silica coating has a surface that has an Ra surface roughness that is less than the Ra surface roughness of the roughened non-planar surface, a thickness between about 0.2 microns and about 10 microns, less than 1% porosity by volume, and contains less than $2E^{12}$ atoms/centimeters$^2$ of aluminum.

21 Claims, 3 Drawing Sheets

(56) References Cited

U.S. PATENT DOCUMENTS

| | | | |
|---|---|---|---|
| 6,780,787 B2* | 8/2004 | O'Donnell | C23C 4/02 |
| | | | 118/719 |
| 2003/0180556 A1 | 9/2003 | Lynn | |
| 2004/0033361 A1* | 2/2004 | Hamaguchi | C23C 16/4404 |
| | | | 428/408 |
| 2004/0238487 A1* | 12/2004 | Kiehlbauch | C03C 23/0075 |
| | | | 216/52 |
| 2005/0150866 A1* | 7/2005 | O'Donnell | C23C 16/4404 |
| | | | 216/67 |
| 2005/0282034 A1* | 12/2005 | Hayasaki | C04B 41/87 |
| | | | 428/632 |
| 2006/0292310 A1 | 12/2006 | Le et al. | |
| 2007/0204147 A1* | 8/2007 | Kobayashi | C23C 16/4404 |
| | | | 713/168 |
| 2008/0063798 A1* | 3/2008 | Kher | C23C 16/45561 |
| | | | 427/255.394 |
| 2009/0194233 A1* | 8/2009 | Tamura | C23C 16/403 |
| | | | 427/454 |
| 2009/0218042 A1* | 9/2009 | Zuck | H01L 21/67069 |
| | | | 156/345.1 |
| 2010/0098964 A1 | 4/2010 | Ruebig | |
| 2010/0119843 A1* | 5/2010 | Sun | H01J 37/32477 |
| | | | 427/523 |
| 2011/0024048 A1 | 2/2011 | Nakamura et al. | |
| 2012/0103526 A1 | 5/2012 | Ouye et al. | |
| 2014/0008352 A1* | 1/2014 | Uemura | H05B 6/62 |
| | | | 219/601 |
| 2014/0272459 A1 | 9/2014 | Daugherty et al. | |
| 2014/0318974 A1 | 10/2014 | Curran et al. | |
| 2015/0021324 A1* | 1/2015 | Sun | C23C 14/0052 |
| | | | 239/589 |
| 2015/0376760 A1 | 12/2015 | Naim et al. | |
| 2016/0362795 A1 | 12/2016 | Lee et al. | |

FOREIGN PATENT DOCUMENTS

| | | |
|---|---|---|
| JP | H11238722 A | 8/1999 |
| JP | 2016525287 A | 8/2016 |
| KR | 20160034298 A | 3/2016 |
| TW | 200706690 A | 2/2007 |
| TW | 200802545 A | 1/2008 |
| TW | 201606105 A | 2/2016 |
| TW | 201643271 A | 12/2016 |
| WO | 2018013909 A1 | 1/2018 |

OTHER PUBLICATIONS

J.W. Klaus and S.M. George, "SiO2 Chemical Vapor Deposition at Room Temperature Using SiCl4 and H2O with an NH3 Catalyst," Journal of The Electrochemical Society, 147 (7) 2658-2664 (2000) S0013-4651(99)06-050-4 CCC: $7.00, Copyright The Electrochemical Society, Inc., accessed via web on May 12, 2016.

Taiwan Office Action dated Jan. 5, 2023, for Taiwan Patent Application No. 108120249.

Japanese Office Action dated May 9, 2023 for Application No. 2020-568515.

Taiwan Office Action dated Jun. 7, 2023 for Application No. 108120249.

Chinese Office Action dated May 23, 2024 for Application No. 201980037849.7.

Korean Office Action dated Jul. 4, 2024 for Application No. 10-2021-7001257.

Taiwan Office Action dated Sep. 5, 2024 for Application No. 112148937.

Chinese Office Action dated Jul. 27, 2024 for Application No. 201980037849.7.

Chinese Office Action dated Oct. 28, 2023 for Application No. 201980037849.7.

Japanese Office Action dated Jan. 28, 2025 for Application No. 2023-210900.

* cited by examiner

| | Li | Be | B | Na | Mg | Al | K | Ca | Ti | V |
|---|---|---|---|---|---|---|---|---|---|---|
| DETECTION LIMIT | 155 | 119 | 199 | 94 | 44 | 80 | 55 | 27 | 22 | 21 |
| MEASUREMENT | <155 | <119 | 885 | <94 | 84 | 199 | <55 | 295 | <22 | <21 |

| | Cr | Mn | Fe | Co | Ni | Cu | Zn | Ga | Ge | As |
|---|---|---|---|---|---|---|---|---|---|---|
| DETECTION LIMIT | 21 | 20 | 19 | 18 | 18 | 17 | 16 | 15 | 30 | 14 |
| MEASUREMENT | <21 | <20 | <19 | <18 | <18 | <17 | 33 | <15 | <30 | <14 |

| | Sr | Zr | Mo | Cd | Sn | Sb | Ba | W | Pb | Bi |
|---|---|---|---|---|---|---|---|---|---|---|
| DETECTION LIMIT | 12 | 12 | 11 | 10 | 9 | 9 | 8 | 6 | 5 | 5 |
| MEASUREMENT | <12 | <12 | 20 | <10 | <9 | <9 | <8 | 51 | <5 | 10 |

FIG. 3

PROCESS CHAMBER PROCESS KIT WITH PROTECTIVE COATING

CROSS-REFERENCE TO RELATED APPLICATION

This application claims benefit of U.S. Provisional Patent Application Ser. No. 62/685,098 filed Jun. 14, 2018, which is incorporated herein by reference.

BACKGROUND

Field

The present disclosure relates generally to tools and components for use in a plasma processing chamber apparatus. More specifically, the present disclosure relates to a method for producing a plasma processing chamber component that is resistive to a corrosive plasma environment.

Description of the Related Art

Semiconductor processing involves a number of different chemical and physical processes whereby minute integrated circuits are created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

A typical semiconductor processing chamber includes a chamber body defining a process zone, a gas distribution assembly adapted to supply a gas from a gas supply into the process zone, a gas energizer, e.g., a plasma generator, utilized to energize the process gas to process a substrate positioned on a substrate support assembly, and a gas exhaust. During plasma processing, the energized gas is often comprised of ions and highly reactive species which etches and erodes exposed portions of the processing chamber components, for example, an electrostatic chuck that holds the substrate during processing. Additionally, processing by-products are often deposited on chamber components which are periodically cleaned typically with highly reactive fluorine. In-situ cleaning procedures used to remove the processing byproducts from within the chamber body may further erode the integrity of the processing chamber components. Attack from the reactive species during processing and cleaning reduces the lifespan of the chamber components and increase service frequency. Additionally, flakes from the eroded parts of the chamber components may become a source of particulate contamination during substrate processing. Further, trace metals from the base material of a chamber component may leach out of the chamber component and contaminate the substrate. As such, the chamber components are generally replaced after a number of process cycles and before the chamber components provide inconsistent or undesirable properties during substrate processing. However, frequent replacement of chamber components reduces service life of the processing chamber, increases chamber downtime, increases maintenance frequency, and reduces substrate yields.

Therefore, there is a need for an improved method for forming chamber components that are more resistive to a plasma processing chamber environment.

SUMMARY

Embodiments described herein generally relate to a method and apparatus for fabricating a chamber component for a plasma process chamber. In one embodiment a chamber component used within a plasma processing chamber is provided that includes a metallic base material comprising a roughened non-planar first surface, wherein the roughened non-planar surface has an Ra surface roughness of between 4 micro-inches and 80 micro-inches, a planar silica coating formed over the roughened non-planar surface, wherein the planar silica coating has a surface that has an Ra surface roughness that is less than the Ra surface roughness of the roughened non-planar surface, a thickness between about 0.2 microns and about 10 microns, less than 1% porosity by volume, and contains less than $2E^{12}$ atoms/centimeters$^2$ of aluminum.

In another embodiment, a method for fabricating a chamber component for use in a plasma processing environment is provided. The method includes forming a body of the chamber component from a metal material, depositing a layer of silica on the body, and heating the layer of silica and the metal material. The layer of silica includes a surface that has an Ra surface roughness that is less than the Ra surface roughness of the roughened non-planar surface, a thickness between about 0.2 microns and about 10 microns, less than 1% porosity by volume, and contains less than $2E^{12}$ atoms/centimeters$^2$ of aluminum.

In another embodiment, a method is provided that includes plasma treating a process chamber with a plasma containing nitrogen or oxygen, the process chamber including the chamber component comprising a metallic base material comprising a roughened non-planar surface, wherein the roughened non-planar surface has an average surface roughness (Ra) of between 4 micro-inches and 80 micro-inches; a planar silica coating formed over the roughened non-planar surface, wherein the planar silica coating has a surface that has an Ra that is less than the Ra of the roughened non-planar surface, a thickness between about 0.2 microns and about 10 microns, less than 1% porosity by volume, and contains less than $2E^{12}$ atoms/centimeters$^2$ of aluminum. The method further includes placing a substrate into the process chamber, wherein a stack is disposed on the substrate, and plasma treating the stack disposed on the substrate

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a data sheet showing testing of the plasma resistant coating on the chamber component as described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
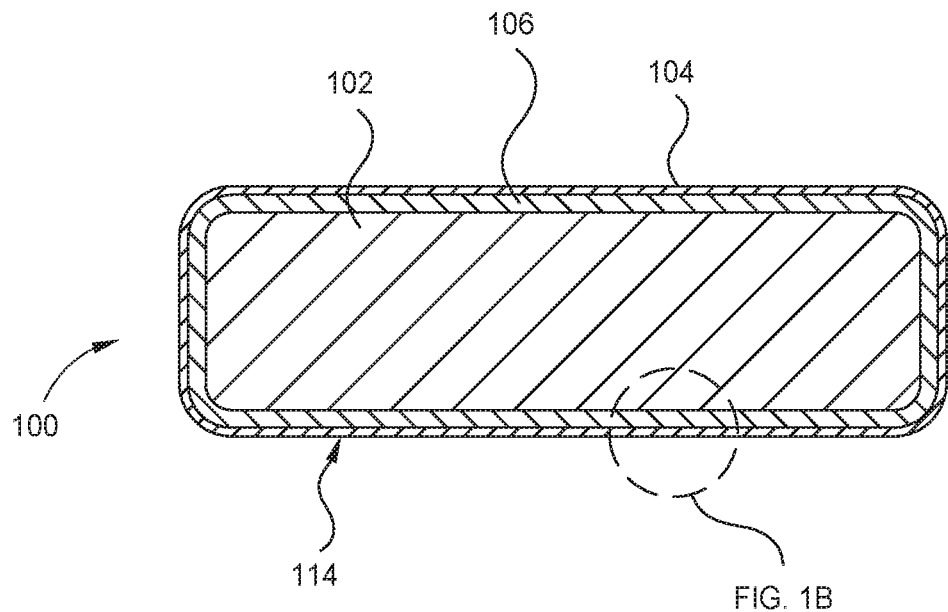
FIG. 1A illustrates a sectional view of one embodiment of a plasma processing chamber component that may be used within a processing chamber.
Figure 1B:
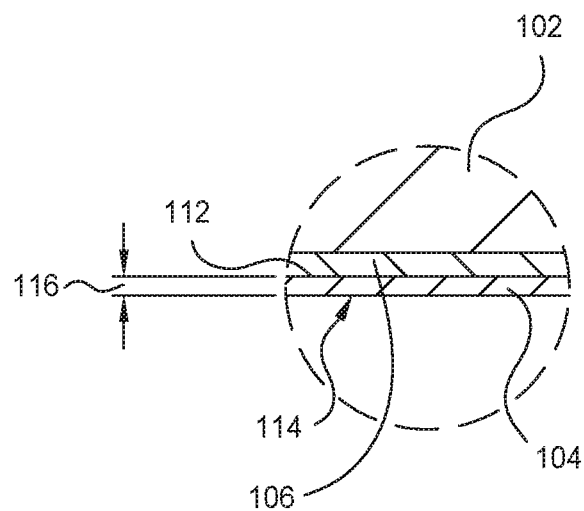
FIG. 1B is an enlarged view of the plasma processing chamber component of FIG. 1A.

FIG. 1A illustrates a sectional view of one embodiment of a plasma processing chamber component 100 that may be used within a processing chamber. FIG. 1B is an enlarged view of the plasma processing chamber component 100 of FIG. 1A. Although the chamber component 100 is shown in FIG. 1A as having a rectangular cross-section, for the purposes of discussion it is understood that the chamber component 100 may take the form of any chamber part, including, but not limited to, a chamber body, a chamber body upper liner, a chamber body lower liner, chamber body plasma door, a cathode liner, a chamber lid gas ring, a throttling gate valve spool, a plasma screen, a pedestal, a substrate support assembly, a showerhead, a gas nozzle, and the like.

The chamber component 100 has at least one exposed surface 114 that is exposed to the plasma environment within the processing chamber when in use. The chamber component 100 includes a body 102 having a plasma resistant coating 104 disposed on an outer surface 112 of a non-planar (roughened) surface 106 of the body 102. The plasma resistant coating 104 fills in pits and valleys of the non-planar surface 106 (e.g., planarizes the non-planar surface 106) to create a surface that is much smoother than the non-planar surface 106.

The body 102 of the chamber component 100 is a metallic material, such as aluminum, stainless steel as well as alloys thereof, or a ceramic material. The plasma resistant coating 104 is a silica material (e.g., silicon dioxide ($SiO_2$)) material that is fully crystallized. A thickness 116 of the plasma resistant coating 104 is about 0.2 microns (μm) to about 10 μm, or greater. The plasma resistant coating 104 has a porosity of less than about 1% by volume. The outer surface 112 is finished to an average surface roughness (Ra) of about 4 micro-inches (μ") to about 80μ". However, the plasma resistant coating 104 has an Ra less than the Ra of the outer surface 112.

The plasma resistant coating 104 is applied using techniques such as painting, spreading, or spraying the outer surface 112 with a silica material. Then, the plasma resistant coating 104 is annealed by placing the coated chamber component 100 in a furnace. The heating relieves surface tension in the plasma resistant coating 104 which makes the plasma resistant coating 104 conformal or flat as well as smooth. The heating may be at a temperature of about 200 degrees Celsius, or less. The heating may be performed for about one hour.

Figure 2:
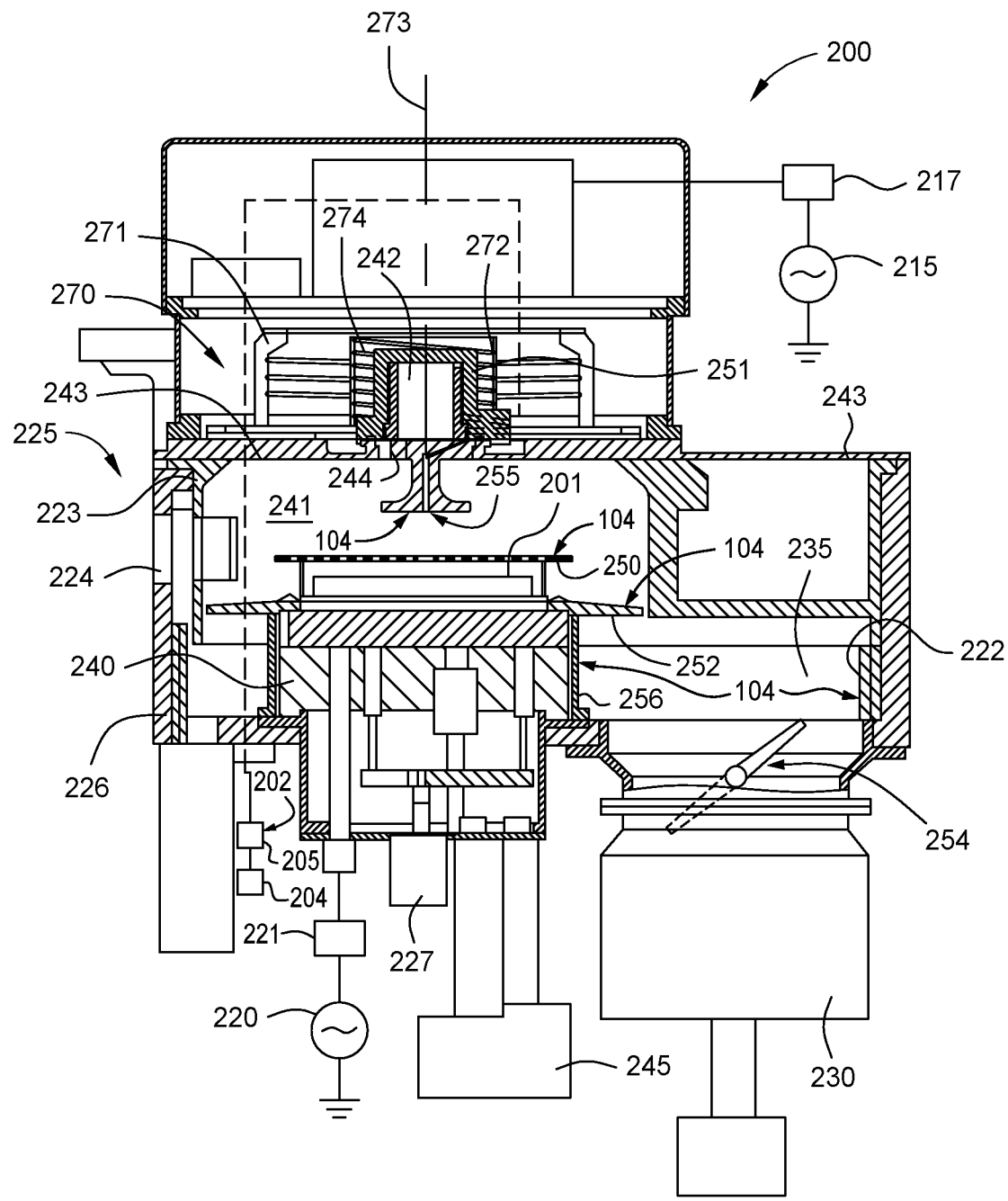
FIG. 2 schematically illustrates a plasma processing system.

FIG. 2 schematically illustrates a plasma processing system 200. The plasma processing system 200 including a chamber body 225 defining a processing volume 241. The chamber body 225 includes a sealable slit valve tunnel 224 to allow entry and egress of a substrate 201 from the processing volume 241. The chamber body 225 includes sidewalls 226 and a lid 243. The sidewalls 226 and lid 243 may be fabricated from metals or ceramic materials and include the plasma resistant coating 104 as described herein. The plasma processing system 200 further comprises an antenna assembly 270 disposed over the lid 243 of the chamber body 225. A radio frequency (RF) power source 215 and a matching network 217 are coupled to the antenna assembly 270 to provide energy for plasma generation.

The antenna assembly 270 comprises one or more coil antennas disposed coaxial with an axis of symmetry 273 (e.g. a longitudinal axis) of the plasma processing system 200. As shown in FIG. 2, the plasma processing system 200 includes an outer coil antenna 271 and an inner coil antenna 272 disposed over the lid 243. In one embodiment, the coil antennas 271, 272 may be independently controlled. It should be noted, even though two coaxial antennas are described in the plasma processing system 200, other configurations, such as one coil antenna, three or more coil antenna configurations may be contemplated.

The inner coil antenna 272 includes one or more electrical conductors wound as a spiral with small pitch and forming an inner antenna volume 274. A magnetic field establishes in an inner antenna volume 274 of the inner coil antenna 272 when an electrical current goes through the one or more electrical conductors. As discussed below, embodiments of the present disclosure provide a chamber extension volume within the inner antenna volume 274 of the inner coil antenna 272 to generate plasma using the magnetic field in the inner antenna volume 274.

It should be noted, that the inner coil antenna 272 and the outer coil antenna 271 may have other shapes according to application, for example to match a certain shape of a chamber wall, or to achieve symmetry or asymmetry within the chamber body 225. In one embodiment, the inner coil antenna 272 and the outer coil antenna 271 may form inner antenna volumes in the shape of hyper-rectangle.

The plasma processing system 200 further includes a substrate support 240 disposed in the processing volume 241. The substrate support 240 supports the substrate 201 during processing. In one embodiment, the substrate support 240 is an electrostatic chuck. A bias power source 220 and a matching network 221 may be connected to the substrate support 240. The bias power source 220 provides bias potential to a plasma generated in the processing volume 241.

In the embodiment shown, the substrate support 240 is surrounded by a ring-shaped cathode liner 256. A plasma containment screen or baffle 252 covers the top of the cathode liner 256 and covers a peripheral portion of the substrate support 240. The substrate support 240 may contain materials that are incompatible or vulnerable to a corrosive plasma processing environment, and the cathode liner 256 and the baffle 252 isolate substrate support 240 from the plasma and contain the plasma within the processing volume 241, respectively. In one embodiment, the cathode liner 256 and baffles 252 may include a high purity plasma resistant coating 104 that is resistive to the plasma contained within the processing volume 241. The plasma resistant coating 104 on the cathode liner 256 and baffles 252 as described above improves the service life of the cathode liner 256 and baffles 252.

A plasma screen 250 is disposed on top of the substrate support 240 to control the spatial distribution of charged and neutral species of the plasma across the surface of the substrate 201. In one embodiment, the plasma screen 250 includes a substantially flat member electrically isolated from the chamber walls and comprises a plurality of apertures that vertically extend through the flat member. The plasma screen 250 may include a high purity plasma resistant coating 104 as described above which resists the process environment within the processing volume 241.

The lid 243 has an opening 244 to allow entrance of one or more processing gases. In one embodiment, the opening 244 may be disposed near a center axis of the plasma processing system 200 that corresponds to the center of the substrate 201 being processed.

The plasma processing system 200 includes a chamber extension 251 disposed over the lid 243 covering the opening 244. In one embodiment, the chamber extension 251 is disposed inside a coil antenna of the antenna assembly 270. The chamber extension 251 defines an extension volume 242 in fluid communication with the processing volume 241 via the opening 244.

The plasma processing system 200 includes a gas distribution showerhead shown as a baffle nozzle assembly 255 disposed adjacent to the opening 244 in the processing volume 241 and the extension volume 242. The baffle nozzle assembly 255 directs one or more processing gases into the processing volume 241 through the extension volume 242. In one embodiment, the baffle nozzle assembly 255 has a by-pass path allowing a processing gas to enter the processing volume 241 without going through the extension volume 242. The baffle nozzle assembly 255 may be fabricated from aluminum and include the plasma resistant coating 104 as described above.

Because the extension volume 242 is within the inner antenna volume 274, processing gas in the extension volume 242 is exposed to the magnetic field of the inner coil antenna 272 prior to entering the processing volume 241. The usage of the extension volume 242 increases the plasma intensity within the processing volume 241 without an increase in power applied to the inner coil antenna 272 or the outer coil antenna 271.

The plasma processing system 200 includes a pump 230, and a throttle valve 235 to provide vacuum and exhaust the processing volume 241. The throttle valve 235 may include a gate valve spool 254. The gate valve spool 254 may be fabricated from aluminum. The plasma processing system 200 further includes a chiller 245 to control the temperature of the plasma processing system 200. The throttle valve 235 may be disposed between the pump 230 and the chamber body 225 and may be operable to control pressure within the chamber body 225.

The plasma processing system 200 also includes a gas delivery system 202 to provide one or more processing gases to the processing volume 241. The gas delivery system 202 is located in a housing 205 disposed directly adjacent to, such as under, the chamber body 225. The gas delivery system 202 selectively couples one or more gas sources located in one or more gas panels 204 to the baffle nozzle assembly 255 to provide process gases to the chamber body 225. The gas delivery system 202 is connected to the baffle nozzle assembly 255 to provide gases to the processing volume 241. The housing 205 is located in close proximity to the chamber body 225 to reduce gas transition time when changing gases, minimize gas usage, and minimize gas waste.

The plasma processing system 200 further includes a lift system 227 for raising and lowering the substrate support 240 that supports the substrate 201 in the chamber body 225.

In the embodiment shown, the chamber body 225 is protected by a lower liner 222 and an upper liner 223 which may be aluminum and include the plasma resistant coating 104 as described above.

The gas delivery system 202 may be used to supply at least two different gas mixtures to the chamber body 225 at an instantaneous rate as further described below. In an optional embodiment, the plasma processing system 200 may include a spectral monitor operable to measure the depth of an etched trench and a deposited film thickness as the trench is being formed in the chamber body 225, with the ability to use other spectral features to determine the state of the reactor. The plasma processing system 200 may accommodate a variety of substrate sizes, for example a substrate diameter of up to about 300 mm or greater.

Various chamber components in the processing system 200 described above may be fabricated using the plasma resistant coating 104 as described above. These chamber components are frequently exposed to the plasma processing environment. For example, the plasma resistant coating 104 may be applied to the chamber body 225, the chamber body upper liner 223, the chamber body lower liner 222, a chamber body plasma door 224, a cathode liner 256, a chamber lid gas ring, a throttling gate valve spool 254, a plasma screen 250, the baffle nozzle assembly 255, baffles 252, and a pedestal or substrate support 240.

FIG. 3 is a data sheet 300 showing testing of the plasma resistant coating 104 on the chamber component 100. The testing of the plasma resistant coating 104 showed low levels of trace metals in or on the plasma resistant coating 104. This evidences that the plasma resistant coating 104 effectively blocks metal atoms from the body 102 of the chamber component 100 from leaching into the coating 104. For example, aluminum concentration in the plasma resistant coating 104 was less than about $2E^{12}$ atoms/centimeter squared (atoms/cm$^2$). Many other trace metals were present in or on the plasma resistant coating 104 but were below critical levels.

The disclosed process chamber and components thereof may be used in one or more substrate processing operations. The below description provides one such exemplary process, but other processes are contemplated.

In one example, a process chamber, such as the chamber body 225, is treated with a $H_2$ plasma without a substrate placed therein. The plasma treatment of the chamber body 225 prior to introducing a substrate to the chamber may be referred to as Plasma Every Wafer (PEW). The plasma treating of the process chamber, or PEW, may include introducing one or more gases, such as $O_2$, $N_2$, $NH_3$, Ar, $H_2$, He, or combinations thereof, into the chamber body 225, and energizing the one or more gases to form a plasma. Alternatively, PEW may include introducing a plasma containing radicals and/or ions of oxygen, nitrogen, hydrogen, ammonia, hydroxide or combination thereof into the chamber body 225, and the plasma is formed in a remote plasma source outside of the chamber body 225.

In one embodiment, $NH_3$ and Ar gases are introduced into the chamber body 225. In another embodiment, $O_2$ and $H_2$ gases are introduced into the chamber body 225. In another embodiment, $O_2$ and Ar gases are introduced into the chamber body 225. In another embodiment, $O_2$ gas is introduced into the chamber body 225. In yet another embodiment, $N_2$ gas is introduced into the chamber body 225. Typically the plasma treatment of the chamber body 225 prior to introducing the substrate involves introducing or forming a plasma containing oxygen or nitrogen in the process chamber.

In some embodiments, the one or more gases are energized by an RF power source. The RF power may be pulsed at 2% to 70% duty cycle and may range from about 100 W to about 2500 W. The RF power may be a continuous wave ranging from about 100 W to about 2500 W. The chamber body 225 may have a chamber pressure ranging from about 10 milli Torr (mT) to about 200 mT during the plasma treatment of the chamber body 225. The process temperature, which may be the temperature of the substrate support pedestal, such as the substrate support 240, may range from 20 degrees C. to about 500 degrees C.

Thereafter, a substrate, optionally having a gate stack thereon, is treated by a hydrogen containing plasma within the chamber body 225. The hydrogen-containing plasma treatment of the substrate may include introducing a hydrogen containing gas, such as $H_2$ gas, or a hydrogen containing gas and an inert gas, such as Ar gas, into the chamber body 225, and energizing the $H_2$ gas or $H_2$/Ar gases to form a hydrogen containing plasma. Ar gas may be added to the $H_2$ gas in order to improve the service lifetime of the chamber body 225 (further mitigating the hydrogen containing plasma attack of components inside the chamber body 225) and to modulate the H* radical concentrations. In some embodiments, the $H_2$ gas or $H_2$/Ar gases are energized by an RF power source, such as the RF power source 215. The RF power may be pulsed at 2% to 60% duty cycle and may range from about 100 W to about 2500 W. The RF power may be a continuous wave ranging from about 100 W to about 2500 W. The chamber body 225 may have a chamber pressure ranging from about 10 mT to about 200 mT during the hydrogen containing plasma treatment of the substrate. The process temperature, which may be the temperature of the substrate support, may range from 20° C. to about 500° C. The substrate may be treated by the hydrogen containing plasma for about 10 to 360 seconds. In one embodiment, the chamber pressure is about 100 mT, the $H_2$ gas is flowed into the chamber body 225 at about 25 standard cubic centimeters per minute (sccm) and Ar gas is flowed into the chamber body 225 at about 975 sccm, the RF power is about 500 W, the process temperature is about 400 degrees C., and the substrate is treated by the hydrogen containing plasma for about 30 to 90 seconds. After the substrate is treated with the hydrogen containing plasma, the substrate may be removed from the chamber body 225.

It is contemplated that other and further processes may be performed within the chamber body 225. Moreover, it is contemplated that coated chamber components may be utilized with other and additional processes.

With the example and explanations above, the features and spirits of the embodiments of the disclosure are described. Those skilled in the art will readily observe that numerous modifications and alterations may be made. Accordingly, the above disclosure should be construed as limited only by the metes and bounds of the appended claims.

The invention claimed is:

1. A chamber component used within a plasma processing chamber, comprising:
   a metallic base material comprising a roughened non-planar surface, wherein the roughened non-planar surface is a metallic surface of the metallic base material, and the roughened non-planar surface has an average surface roughness (Ra) of between 4 micro-inches and 80 micro-inches; and
   a silica coating formed over the roughened non-planar surface, wherein:
      the silica coating has a surface that has an Ra that is less than the Ra of the roughened non-planar surface,
      the silica coating has a thickness between about 0.2 microns and about 10 microns,
      the silica coating has less than 1% porosity by volume, and
      the formed silica coating blocks aluminum atoms from leaching from the metallic base material and into the formed silica coating such that the surface of the formed silica coating contains more than 0 atoms/centimeters$^2$ of aluminum and less than $2E^{12}$ atoms/centimeters$^2$ of aluminum.

2. The chamber component of claim 1, wherein the metallic base material comprises aluminum.

3. The chamber component of claim 1, wherein the metallic base material comprises a gas distribution showerhead.

4. The chamber component of claim 1, wherein the metallic base material comprises a nozzle assembly.

5. The chamber component of claim 1, wherein the metallic base material comprises a baffle.

6. The chamber component of claim 1, wherein the metallic base material comprises a liner.

7. The chamber component of claim 6, wherein the liner comprises a cathode liner.

8. The chamber component of claim 1, wherein:
   the roughened non-planar surface comprises pits, and the silica coating fills in the pits; and
   the silica coating is fully crystallized.

9. A method for fabricating a chamber component for use in a plasma processing environment, comprising:
   forming a body of the chamber component from a metallic base material comprising a roughened non-planar surface, wherein the roughened non-planar surface is a metallic surface of the metallic base material, and the roughened non-planar surface has an average surface roughness (Ra) of between 4 micro-inches and 80 micro-inches;
   forming a layer of silica coating on the body over the roughened non-planar surface; and
   heating the layer of silica coating and the metallic base material, wherein:
      the layer of silica coating has a surface that has an Ra that is less than the Ra of the roughened non-planar surface,
      the layer of silica coating has a thickness between about 0.2 microns and about 10 microns,
      the layer of silica coating has less than 1% porosity by volume, and
      the formed silica coating blocks aluminum atoms from leaching from the metallic base material and into the formed silica coating such that the surface of the layer of the formed silica coating contains more than 0 atoms/centimeters$^2$ of aluminum and less than $2E^{12}$ atoms/centimeters$^2$ of aluminum.

10. The method of claim 9, wherein the metallic base material comprises aluminum.

11. The method of claim 9, wherein the metallic base material comprises a gas distribution showerhead.

12. The method of claim 9, wherein the metallic base material comprises a nozzle assembly.

13. The method of claim 9, wherein the metallic base material comprises a baffle.

14. The method of claim 9, wherein the metallic base material comprises a liner.

15. The method of claim 14, wherein the liner comprises a cathode liner.

16. A method, comprising:
   plasma treating a process chamber with a plasma containing nitrogen or oxygen, the process chamber including a chamber component comprising:
   a metallic base material comprising a roughened non-planar surface, wherein the roughened non-planar surface is a metallic surface of the metallic base material, and the roughened non-planar surface has an average surface roughness (Ra) of between 4 micro-inches and 80 micro-inches;

a planar silica coating formed over the roughened non-planar surface, wherein:
   the planar silica coating has a surface that has an Ra that is less than the Ra of the roughened non-planar surface,
   the planar silica coating has a thickness between about 0.2 microns and about 10 microns,
   the planar silica coating has less than 1% porosity by volume, and
   the formed planar silica coating blocks aluminum atoms from leaching from the metallic base material and into the formed planar silica coating such that the surface of the formed planar silica coating contains more than 0 atoms/centimeters$^2$ of aluminum and less than $2E^{12}$ atoms/centimeters$^2$ of aluminum;
placing a substrate into the process chamber, wherein a stack is disposed on the substrate; and
plasma treating the stack disposed on the substrate.

17. The method of claim 16, wherein the plasma containing nitrogen or oxygen is formed by introducing one or more gases into the process chamber and energizing the one or more gases.

18. The method of claim 17, wherein the one or more gases comprise $O_2$, $N_2$, $NH_3$, Ar, $H_2$, He, or a combination thereof.

19. The method of claim 16, wherein the plasma treating the stack comprises treating the stack with a plasma containing ammonia.

20. The method of claim 19, wherein forming the plasma containing ammonia further comprises introducing a hydrogen containing gas and an inert gas into the process chamber and energizing the hydrogen containing gas and the inert gas.

21. The method of claim 16, wherein the plasma treating the stack comprises treating the stack with a plasma containing nitrogen.

* * * * *